(12) United States Patent
Arvin et al.

(10) Patent No.: US 10,249,586 B2
(45) Date of Patent: Apr. 2, 2019

(54) MIXED UBM AND MIXED PITCH ON A SINGLE DIE

(71) Applicant: International Business Machines Corporation, Armonk, NY (US)

(72) Inventors: Charles L. Arvin, Poughkeepsie, NY (US); Christopher D. Muzzy, Burlington, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/711,016

(22) Filed: Sep. 21, 2017

(65) Prior Publication Data
US 2018/0102336 A1 Apr. 12, 2018

Related U.S. Application Data

(62) Division of application No. 15/291,767, filed on Oct. 12, 2016, now Pat. No. 9,799,618.

(51) Int. Cl.
*H01L 23/00* (2006.01)
*H01L 21/66* (2006.01)
*H01L 23/498* (2006.01)

(52) U.S. Cl.
CPC .............. *H01L 24/06* (2013.01); *H01L 22/20* (2013.01); *H01L 23/49816* (2013.01); *H01L 24/03* (2013.01); *H01L 24/05* (2013.01); *H01L 24/11* (2013.01); *H01L 24/13* (2013.01); *H01L 24/16* (2013.01); *H01L 24/81* (2013.01); *H01L 2224/0401* (2013.01); *H01L 2224/05113* (2013.01); *H01L 2224/05155* (2013.01);
(Continued)

(58) Field of Classification Search
CPC ... H01L 24/06; H01L 23/49816; H01L 24/05; H01L 24/11; H01L 24/03; H01L 24/13; H01L 22/20
See application file for complete search history.

(56) References Cited

U.S. PATENT DOCUMENTS

| 7,420,280 B1* | 9/2008 | Kelkar | H01L 24/10 257/738 |
| 9,799,618 B1 | 10/2017 | Arvin et al. | |
| 2008/0050906 A1* | 2/2008 | Lee | H01L 24/05 438/614 |

(Continued)

OTHER PUBLICATIONS

List of IBM Patents or Patent Applications Treated as Related, U.S. Appl. No. 15/711,016, filed Sep. 21, 2017, 2 Pages.

(Continued)

*Primary Examiner* — Tom Thomas
*Assistant Examiner* — Benjamin T Liu
(74) *Attorney, Agent, or Firm* — Cantor Colburn LLP; Steven Meyers

(57) ABSTRACT

Embodiments are directed to a method of forming a semiconductor chip package and resulting structures having a mixed under-bump metallization (UBM) size and pitch on a single die. A first set of UBMs having a first total plateable surface area is formed on a first region of a die. A second set of UBMs having an equal total plateable surface area is formed on a second region of the die. A solder bump having a calculated solder height is applied to a plateable surface of each UBM. The solder height is calculated such that a volume of solder in the first region is equal to a volume of solder in the second region.

14 Claims, 8 Drawing Sheets

(52) U.S. Cl.
CPC ............... *H01L 2224/05647* (2013.01); *H01L 2224/05666* (2013.01); *H01L 2224/0603* (2013.01); *H01L 2224/06131* (2013.01); *H01L 2224/06132* (2013.01); *H01L 2224/06134* (2013.01); *H01L 2224/06177* (2013.01); *H01L 2224/11001* (2013.01); *H01L 2224/116* (2013.01); *H01L 2224/1145* (2013.01); *H01L 2224/1161* (2013.01); *H01L 2224/11462* (2013.01); *H01L 2224/131* (2013.01); *H01L 2224/136* (2013.01); *H01L 2224/13026* (2013.01); *H01L 2224/13028* (2013.01); *H01L 2224/13078* (2013.01); *H01L 2224/13082* (2013.01); *H01L 2224/13083* (2013.01); *H01L 2224/13147* (2013.01); *H01L 2224/13155* (2013.01); *H01L 2224/13166* (2013.01); *H01L 2224/13184* (2013.01); *H01L 2224/13562* (2013.01); *H01L 2224/13639* (2013.01); *H01L 2224/16227* (2013.01); *H01L 2224/81815* (2013.01); *H01L 2924/07025* (2013.01)

(56) References Cited

U.S. PATENT DOCUMENTS

| | | | |
|---|---|---|---|
| 2013/0119532 A1* | 5/2013 | Lin | H01L 24/05 257/737 |
| 2015/0130049 A1* | 5/2015 | Chen | H01L 24/05 257/737 |
| 2018/0102335 A1 | 4/2018 | Arvin et al. | |

OTHER PUBLICATIONS

Charles L. Arvin, et al. "Mixed UBM and Mixed Pitch on a Single Die," U.S. Appl. No. 15/291,767, filed Oct. 12, 2016.
Charles L. Arvin, et al. "Mixed UBM and Mixed Pitch on a Single Die," U.S. Appl. No. 15/710,981, filed Sep. 21, 2017.
Arvin, Charles L. et al. "Mixed UBM and Mixed Pitch on a Single Die," U.S. Appl. No. 16/030,973, filed Jul. 10, 2018.
IBM "List of IBM Patents or Patent Applications Treated As Related (Appendix P)"; Filed Jul. 10, 2018, 2 pages.

* cited by examiner

MIXED UBM AND MIXED PITCH ON A SINGLE DIE

DOMESTIC AND/OR FOREIGN PRIORITY

This application is a divisional of U.S. application Ser. No. 15/291,767, titled "MIXED UBM AND MIXED PITCH ON A SINGLE DIE" filed Oct. 12, 2016, the entire contents of which are incorporated herein by reference.

BACKGROUND

The present invention relates in general to semiconductor chip packages. More specifically, the present invention relates to fabrication methods and resulting structures for a semiconductor chip package having a mixed under-bump metallization (UBM) size and pitch on a single die.

A semiconductor chip, also commonly referred to as an integrated circuit (IC) chip or a die is typically assembled into a semiconductor chip package that is soldered to a printed circuit board. One type of semiconductor chip package is a flip chip, also known as a controlled collapse chip connection ("C4") package. The semiconductor chip package typically includes the IC chip, which contains a number of round solder bumps that are attached to a top surface of the chip. The IC chip, via the solder bumps, is soldered to solder pads located along a surface of a package substrate, forming a metallurgical joint between the chip and the substrate. On package I/O (OPIO), optics, and dual chip modules (DCM) are becoming key components for enabling next generation semiconductor chip packaging, especially for server systems. These next generation packages include under-bump metallization (UBM) stacks that provide an electrical connection from the die to the solder bump. UBM stacks, also referred to as C4s, include one or more stacked metallization layers. C4s carry electrical current between the semiconductor chip and the substrate.

SUMMARY

According to embodiments of the present invention, a method of fabricating a semiconductor chip package having a mixed UBM size and pitch on a single die is provided. The method can include forming a first set of UBMs having a first total plateable surface area is formed on a first region of a die. A second set of UBMs having an equal total plateable surface area is formed on a second region of the die. A solder bump having a calculated solder height is applied to a plateable surface of each UBM. The solder height is calculated such that a volume of solder in the first region is equal to a volume of solder in the second region.

According to embodiments of the present invention, a method of fabricating a semiconductor chip package having a mixed UBM size and pitch on a single die is provided. The method can include forming a sputtering stack on a photosensitive polyimide (PSPI) layer. The sputtering stack includes a poor C4 adhesion layer and a strong C4 adhesion layer. At least one temporary C4 is formed on the poor C4 adhesion layer and at least one active C4 is formed on the strong C4 adhesion layer. The temporary C4 is removed after electroplating.

According to embodiments of the present invention, a method of fabricating a semiconductor chip package having a mixed UBM size and pitch on a single die is provided. The method can include forming a set of micro UBMs on a surface of a PSPI layer in a first region of a die. Each micro UBM includes an individual via electrically coupling the UBM to a contact region of the die. A large solder bump electrically shorts the set of micro UBMs to a contact region of a laminate.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
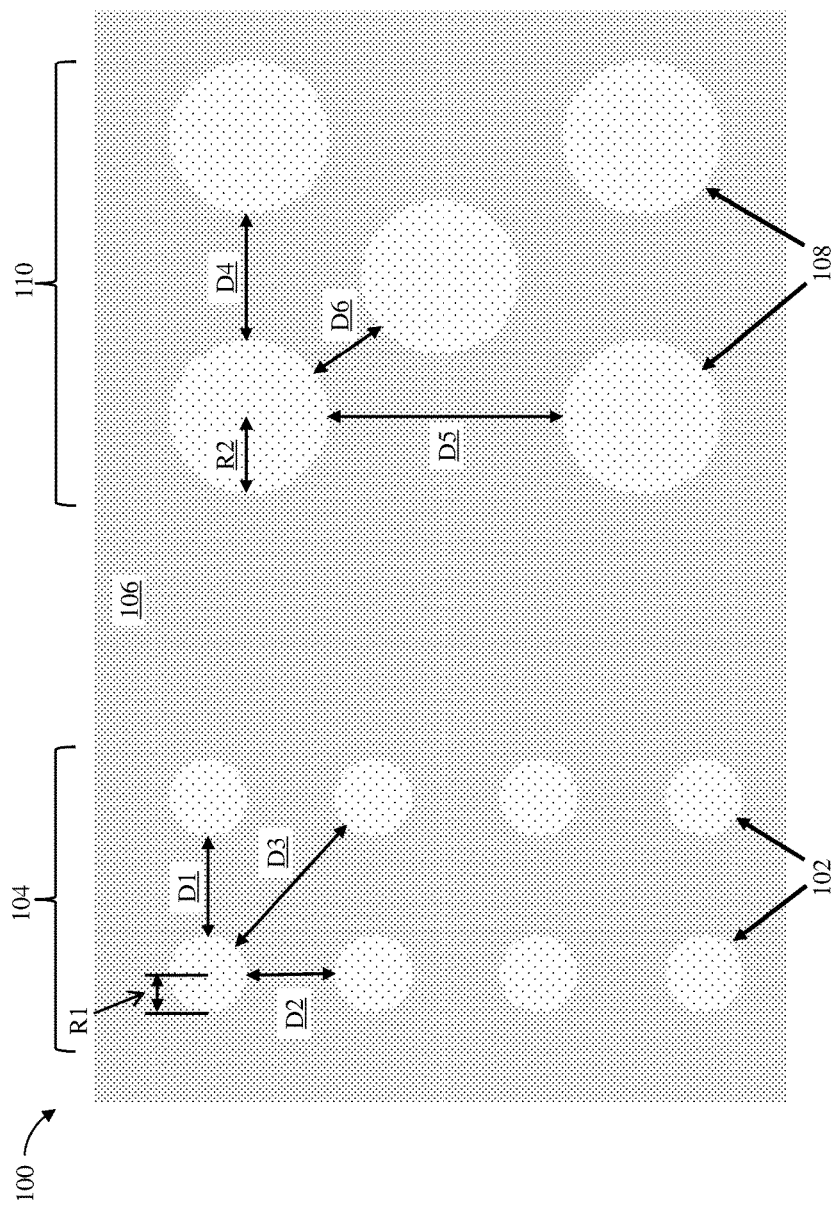
FIG. 1 depicts a top-down view of a structure having a first set of UBMs formed on a first region of a die and a second set of UBMs formed on a second region of the die during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators, and selectively doped regions are built up to form the final device.

Turning now to a more detailed description of technologies relevant to the present invention, as previously noted herein, next generation chip packages include UBM stacks (also known as "C4s," "pillars," or "pedestals") that provide an electrical connection from a die to a solder bump. Conventionally, dual or multi-processor chip packages include a single UBM size and a single UBM pitch on each die, due to the inability of current flip-chip C4 technology to plate differently sized or spaced UBMs on the same die without introducing UBM height or composition variations. Consequently, conventional packages having multiple UBM sizes or pitch require additional fan outs within the laminate, an interposer or silicon bridge to connect the dies, and additional space on each die connecting a processor to a cache chip. Moreover, as the packages become smaller and critical dimensions shrink it is becoming necessary to add additional de-coupling capacitance. One option for addressing some of these problems would be to remove C4s from directly under the core of a processor. To do so, however, would require that the plateable height and stand-off distance of each C4 is well-controlled. This is not possible with current flip-chip C4 technology. Thus, a method and structure are desired for a semiconductor chip package having a mixed UBM size and pitch formed on a single die without compromising uniform plating height and composition.

Turning now to an overview of aspects of the present invention, one or more embodiments provide methods of fabricating a semiconductor chip package having a mixed UBM size and mixed UBM pitch on a single die. The described methods employ three related techniques that can be used separately or as a combination. One or more embodiments provide a method for forming a first set of UBMs in a first region of a die and a second set of UBMs in a second region of the die. The number, radius, and spacing of the UBMs in each region are adjusted such that the first and second regions have a matching plateable surface area. Solder bumps having a matching solder height are applied to each UBM. The solder height is calculated such that a volume of solder in the first region is equal to a volume of solder in the second region. One or more embodiments provide a method for forming temporary C4s on a poor C4 adhesion layer of a die. The temporary C4s enable uniform plating but are removed during subsequent processing. The temporary C4s act as a current thief and as a mass transport thief on an active region of the die. One or more embodiments provide a method for forming an array of micro C4s, each having an individual via, over an entire surface of a die. In regions of the die that do not have pitch constraints (e.g., an inner region of the die, rather than an edge region of the die) multiple micro C4s can be shorted to a single large solder contact to act as a single C4 having a larger diameter.

Methods for forming a single die having multiple UBM sizes and UBM pitches and the resulting structures therefrom in accordance with embodiments of the present invention are described in detail below by referring to the accompanying drawings in FIGS. 1-8.

FIG. 1 illustrates a top-down view of a structure 100 having a first set of UBMs 102 formed on a first region 104 of a die 106 and a second set of UBMs 108 formed on a second region 110 of the die 106 during an intermediate operation of a method of fabricating a semiconductor device according to one or more embodiments. For clarity, only a few UBMs are depicted in each region 104 and 110. It is understood, however, that the regions 104 and 110 can each include fewer UBMs or more UBMs. The UBMs can be conventional pedestal metallization stacks (e.g., TiW/Cu or Ti/Cu stacks) formed using known methods or modified stacks (e.g., Ni/Cu/Ni/Cu/Solder stacks) formed according to one or more embodiments. Each UBM in the first set of UBMs 102 includes a plateable surface having a first radius R1. Similarly, each UBM in the second set of UBMs 108 includes a plateable surface having a second radius R2. In some embodiments, the first radius R1 is not equal to the second radius R2. In some embodiments, the second radius R2 is larger than the first radius R1. In still other embodiments, the second radius R2 is much larger than the first radius R1 (i.e., the first radius R1 is less than about 30% of the second radius R2).

In some embodiments, the spacing between adjacent UBMs (also known as the UBM "pitch") in the first region 104 is different than the pitch in the second region 110. For example, each UBM in the first set of UBMs 102 can be horizontally separated from an adjacent UBM by a pitch D1, vertically separated from an adjacent UBM by a pitch D2, and diagonally separated from an adjacent UBM by a pitch D3. Conversely, each UBM in the second set of UBMs 108 can be separated by horizontal, vertical, and diagonal pitches D4, D5, and D6, respectfully. In some embodiments, the horizontal pitches D1 and D4, the vertical pitches D2 and D5, and/or the diagonal pitches D3 and D6 are not equal. For example, the horizontal pitch D1 in the first region 104 can be less than, or greater than, the horizontal pitch D4 in the second region 110.

In some embodiments, the number, radius, and spacing of the UBMs in a region (e.g., the first region 104) are adjusted such that the first and second regions 104 and 110 have a matching total plateable surface area. Ensuring that the total plateable surface area in the first and second regions 104 and 110 are equal prevents forming UBMs having non-uniform Ni layer or solder thicknesses. For example, a total plateable surface area can be calculated for the second region 110 based on a desired total number of UBMs in the second set of UBMs 108, pitches D4, D5, and D6, and second radius R2. A total number of UBMs, the pitches D1, D2, and D3, and the first radius R1 can then be selected such that the total plateable surface area in the first and second regions 104 and 110 are equal. In some embodiments, the number, radius, and spacing are adjusted using an iterative approach until the total plateable surface area in the first and second regions 104 and 110 are equal. In some embodiments, the number of UBMs in both regions 104 and 110 are fixed and only the radius and spacing for one of the regions (e.g., the first region 104) is adjusted.

Figure 2:
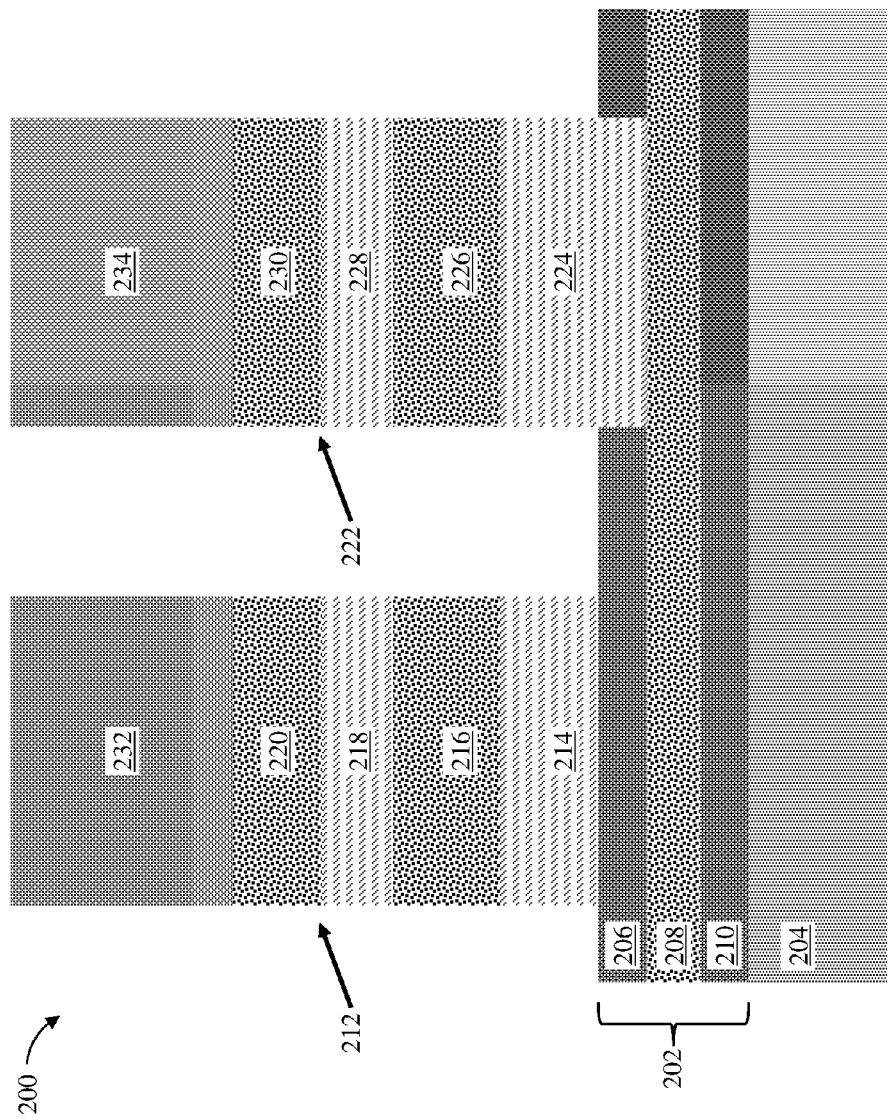
FIG. 2 depicts a cross-sectional view of a structure after forming a sputtering stack on a PSPI layer during an intermediate operation of a method of fabricating a semiconductor device according to one or more embodiments of the present invention.

In some embodiments, solder bumps (as depicted in FIG. 2) having a single matching solder height are applied to a surface of each UBM. In some embodiments, each solder bump includes an amount (i.e., concentration) of a first material, such as, for example, silver. In some embodiments, the solder height is calculated such that a volume of solder in the first region 104 is equal to a volume of solder in the second region 110. In this manner, the amount of the first material in the first region 104 is equal to the amount of the first material in the second region 110. In some embodiments, the solder height must be further adjusted before plating to account for the difference in density of the solder before and after reflow.

FIG. 2 illustrates a cross-sectional view of a structure 200 after forming a sputtering stack 202 on a photosensitive polyimide (PSPI) layer 204 during an intermediate operation of a method of fabricating a semiconductor device according to one or more embodiments. In some embodiments, the PSPI layer 204 is a patterned PSPI layer formed on a bulk substrate (e.g., semiconductor wafer, glass, or board line). In some embodiments, the bulk substrate includes a nitride layer formed on an oxide layer. In some embodiments, the PSPI layer 204 is about 3 microns thick.

The sputtering stack 202 includes a poor C4 adhesion layer 206 formed on a strong C4 adhesion layer 208. As used herein, a "poor" C4 adhesion layer is a layer having a composition that allows for a C4 formed on the layer to be removed after plating using a removal operation (e.g., photo-removal, an etch process, stripping, or a high-pressure spray). For example, the poor C4 adhesion layer 206 can be Ti or a metal alloy including Ti. Conversely, a "strong" C4 adhesion layer is a layer having a composition that allows for a good C4 adhesion interface and a C4 that is not removable after plating using the removal operation. For example, the strong C4 adhesion layer 208 can be Cu or a metal alloy including Cu. In some embodiments, each layer of the sputtering stack 202 is formed using known processes, such as, for example, dry PVD. In some embodiments, each layer of the sputtering stack 202 is patterned using known photolithographic processes.

In some embodiments, the sputtering stack 202 includes a first sputtering layer 210 formed between the PSPI layer 204 and the strong C4 adhesion layer 208. The first sputtering layer 210 can be, for example, Ti, a titanium-tungsten alloy (TiW), or a metal alloy including Ti or TiW. In some embodiments, the first sputtering layer 210 is a multilayer refractory metal composite which can include at least one of TiW, Ta, TaN, Ti, TiN, Ni, Cu, or Bi. In some embodiments, the first sputtering layer 210 is a Ti or TiW layer having a thickness of about 0.165 microns. In some embodiments, the strong C4 adhesion layer 208 is a Cu layer having a thickness of about 0.45 microns. In some embodiments, the poor C4 adhesion layer 206 is a Ti layer having a thickness of about 0.01 microns. In some embodiments, the poor C4 adhesion layer 206 is a Ti layer having a thickness of about 0.01 microns. In some embodiments, portions of the poor C4 adhesion layer 206 are exposed to air and consequently oxidized to form a titanium oxide layer.

A temporary C4 212 is formed on the poor C4 adhesion layer 206. The temporary C4 212 acts as a current thief and as a mass transport thief on an active region of the structure 200 that is formed to ensure uniform C4 plating but that is removed during subsequent processing by, for example, a post-plating removal operation. In this manner it is possible to form a die having an extreme mixed pitch or an array of UBMs having large differences in diameter. In some embodiments, the smallest UBM on a die can have a diameter that is less than 30% the diameter of the largest UBM on the die. For ease of discussion only a single temporary C4 is shown. It is understood, however, that the structure 200 can include a plurality of temporary C4s formed according to one or more embodiments. The temporary C4s can be formed having one or more diameters according to one or more embodiments. In some embodiments, a diameter of a first temporary C4 is larger than a diameter of a second temporary C4.

The temporary C4 212 includes a first ball limiting metallurgy (BLM) layer 214 formed on a surface of the poor C4 adhesion layer 206. In some embodiments, the first BLM layer 214 includes Ni. In some embodiments, the first BLM layer 214 is a Ni layer having a thickness of about 1 micron. A first metallization layer 216 is formed on the first BLM layer 214. In some embodiments, the first metallization layer 216 includes Cu. In some embodiments, the first metallization layer 216 is a Cu pillar having a thickness of about 9 microns to about 20 microns. A second BLM layer 218 formed on the first metallization layer 216. In some embodiments, the second BLM layer 218 includes Ni. In some embodiments, the second BLM layer 218 is a Ni layer having a thickness of about 2 microns. A second metallization layer 220 is formed on the second BLM layer 218. In some embodiments, the second metallization layer 220 includes Cu. In some embodiments, the second metallization layer 220 is a Cu layer having a thickness of about 1 micron.

At least one active C4 222 is formed on the strong C4 adhesion layer 208. The active C4 222 can be formed in a like manner and composition as the temporary C4 212. For ease of discussion only a single active C4 is shown. It is understood, however, that the structure 200 can include a plurality of active C4s formed according to one or more embodiments. In some embodiments, the active C4 222 includes a first ball limiting metallurgy (BLM) layer 224, a first metallization layer 226, a second BLM layer 228, and a second metallization layer 230. The active C4s can be formed having one or more diameters according to one or more embodiments. In some embodiments, a diameter of a first active C4 is larger than a diameter of a second active C4.

In some embodiments, the temporary C4 212 and the active C4 222 are electroplated. As discussed previously herein, the temporary C4 212 acts as a current thief and as a mass transport thief to ensure uniform plating. After all, C4s (e.g. both active and temporary C4s) are plated the temporary C4 212 is removed using a removal operation, such as, for example, photo-removal, an etch process, stripping, or a high pressure spray. As the active C4 222 is formed on the strong C4 adhesion layer 208 the active C4 222 will not be removed during the removal operation.

In some embodiments, solder bumps 232 and 234 are formed on a surface of the second metallization layers 220 and 230, respectfully. In some embodiments, the solder bumps 232 and 234 are formed using a lead-free solder such as, for example, SnAg. In some embodiments, the solder bumps 232 and 234 are formed using a lead-free tin-based solder such as, for example, pure Sn, pure Sn followed by pure Ag, SnBi, SnAg, SnAgCu, or other known lead-free tin-based solders.

Figure 3:
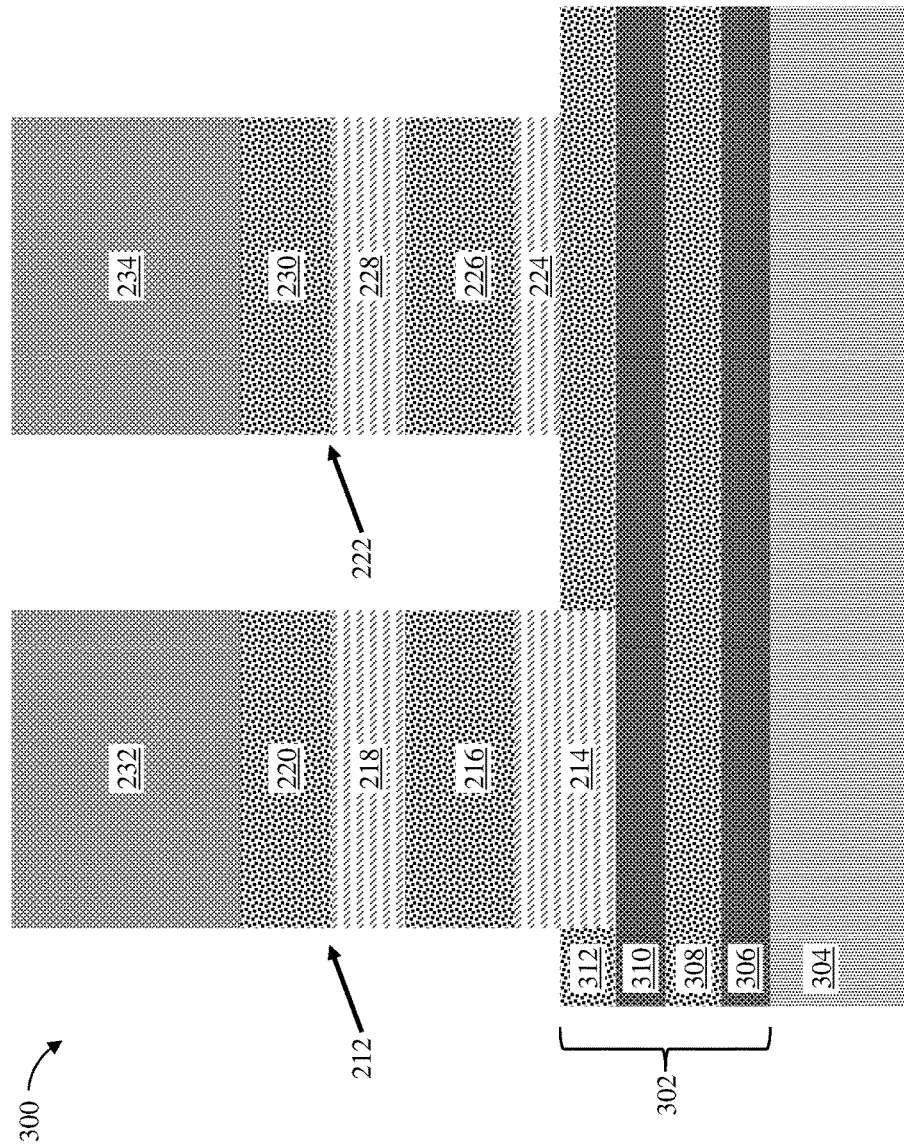
FIG. 3 depicts a cross-sectional view of an alternative structure after forming a sputtering stack on a PSPI layer during an intermediate operation of a method of fabricating a semiconductor device according to one or more embodiments of the present invention.

FIG. 3 illustrates a cross-sectional view of a structure 300 after forming a sputtering stack 302 on a PSPI layer 304 during an intermediate operation of a method of fabricating a semiconductor device according to one or more embodiments. In some embodiments, the PSPI layer 304 is a patterned PSPI layer formed on a bulk substrate in a similar manner as the PSPI layer 204 (as depicted in FIG. 2).

The sputtering stack 302 includes a first sputtering layer 306 formed on the PSPI layer 304 and a second sputtering layer 308 formed on the first sputtering layer 306. The first sputtering layer 306 can be, for example, Ti, TiW, or a metal alloy including Ti or TiW. In some embodiments, the first sputtering layer 306 is a Ti or TiW layer having a thickness of about 0.165 microns. The second sputtering layer 308 can be, for example, Cu or a metal alloy including Cu. In some embodiments, the second sputtering layer 308 is a Cu layer having a thickness of about 0.45 microns.

A poor C4 adhesion layer 310 is formed on the second sputtering layer 308. In some embodiments, the poor C4 adhesion layer 310 is a Ti layer having a thickness of about 0.01 microns. In some embodiments, a strong C4 adhesion layer 312 is formed on the poor C4 adhesion layer 310. In some embodiments, the strong C4 adhesion layer 312 is a Cu layer having a thickness of about 0.01 microns.

One or more temporary C4s (e.g., the temporary C4 212 as depicted in FIG. 2) and one or more active C4s (e.g., the active C4 222 as depicted in FIG. 2) are formed on the poor C4 adhesion layer 310 and the strong C4 adhesion layer 312, respectfully, according to one or more embodiments. In some embodiments, the temporary C4 212 and the active C4 222 are electroplated. In some embodiments, after all C4s (e.g. both active and temporary C4s) are plated the temporary C4s (e.g., temporary C4 212) are removed using a removal operation, such as, for example, photo-removal, an etch process, stripping, or a high-pressure spray.

Figure 4:
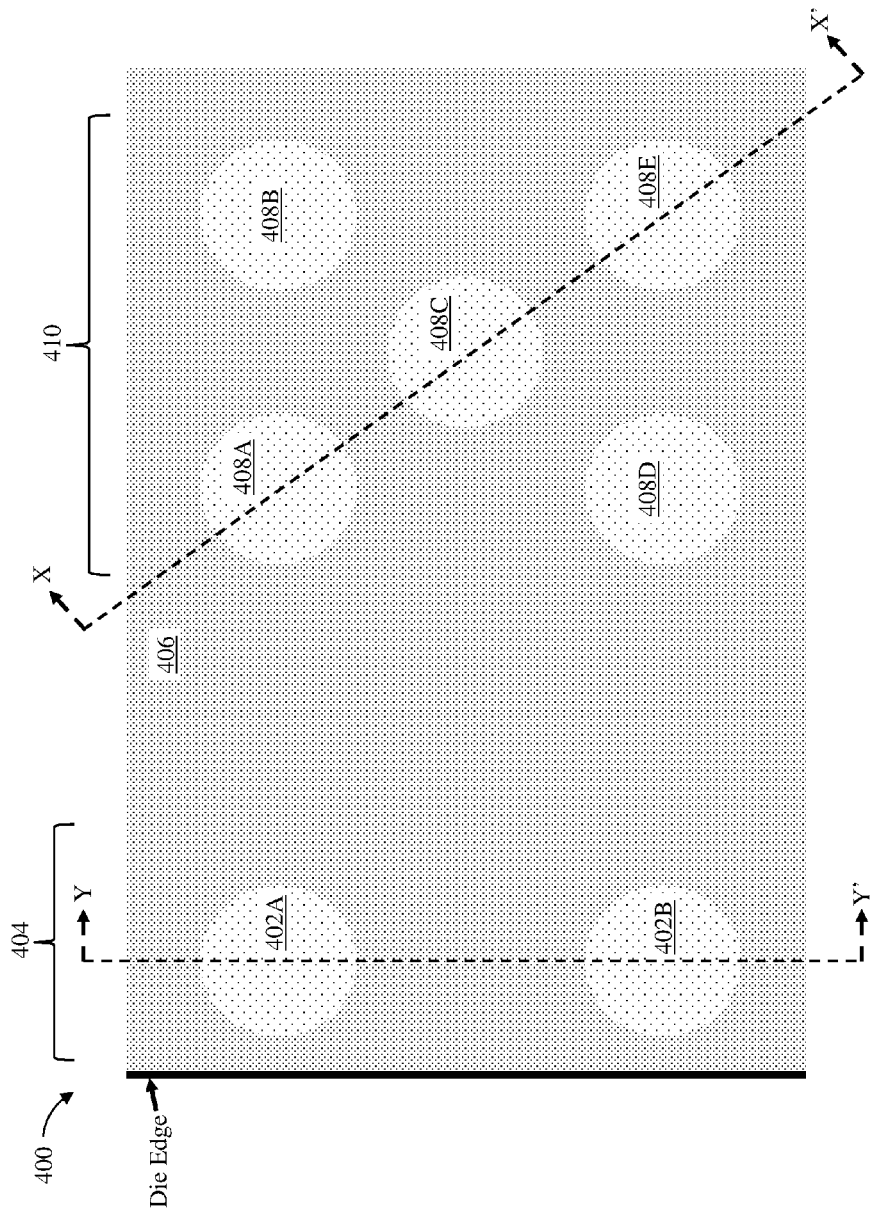
FIG. 4 depicts a top-down view of a structure having a first set of micro UBMs formed on a first region of a die and a second set of micro UBMs formed on a second region of the die during an intermediate operation of a method of fabricating a semiconductor device according to one or more embodiments of the present invention.

FIG. 4 illustrates a top-down view of a structure 400 having a first set of micro UBMs 402A and 402B formed on a first region 404 of a die 406 and a second set of micro UBMs 408A-E formed on a second region 410 of the die 406 during an intermediate operation of a method of fabricating a semiconductor device according to one or more embodiments. In some embodiments, the first region 404 is an outer region of the die 406 adjacent to the die edge. In some embodiments, the first region 404 is adjacent to an interposer edge. In some embodiments, the second region 410 is an inner region of the die 406. For clarity only micro UBMs 402A and 402B, and micro UBMs 408A-E are depicted in regions 404 and 410, respectfully. It is understood, however, that the regions 404 and 410 can each include more or less micro UBMs. In some embodiments, the first and second set of micro UBMs form an array of micro UBMs covering the entire surface of the die 406. In regions of the die 406 not subject to pitch constraints (e.g., inner regions of the die, such as the second region 410), two or more of the micro UBMs can be shorted together to act as a single, larger UBM. In other regions of the die 406 subject to pitch constraints (e.g., outer regions of the die near a die edge, such as the first region 404) the micro UBMs are not shorted together. In this manner, the micro UBMs can be used for both micro-pillar connections and large UBM connections. In some embodiments, a diameter of each micro UBM is less than about 92 microns, or less than about 110 microns.

Figure 5:
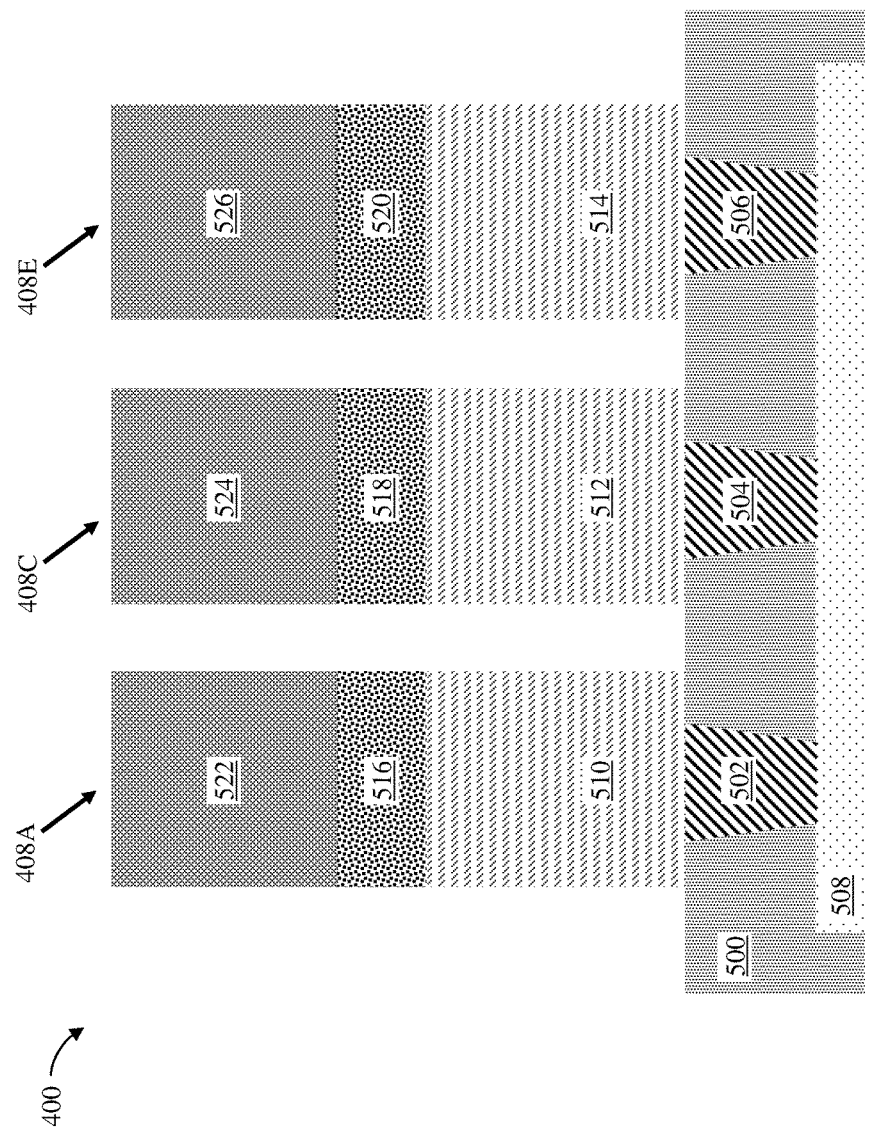
FIG. 5 depicts a cross-sectional view of the second region of the structure depicted in FIG. 4 along the line X-X' during an intermediate operation of a method of fabricating a semiconductor device according to one or more embodiments of the present invention.

FIG. 5 illustrates a cross-sectional view of the second region 410 of the structure 400 along the line X-X' of FIG. 4 during an intermediate operation of a method of fabricating a semiconductor device according to one or more embodiments. In some embodiments, the second region 410 is an inner region of the die 406. In some embodiments, a sputtering stack (not depicted) is formed on a PSPI layer 500 according to one or more embodiments. In some embodiments, a contact region 508 is formed in the PSPI layer 500 under the micro UBMs 408A, 408C, and 408E. The contact region 508 can be of any suitable contact material, such as, for example, aluminum.

Figure 6:
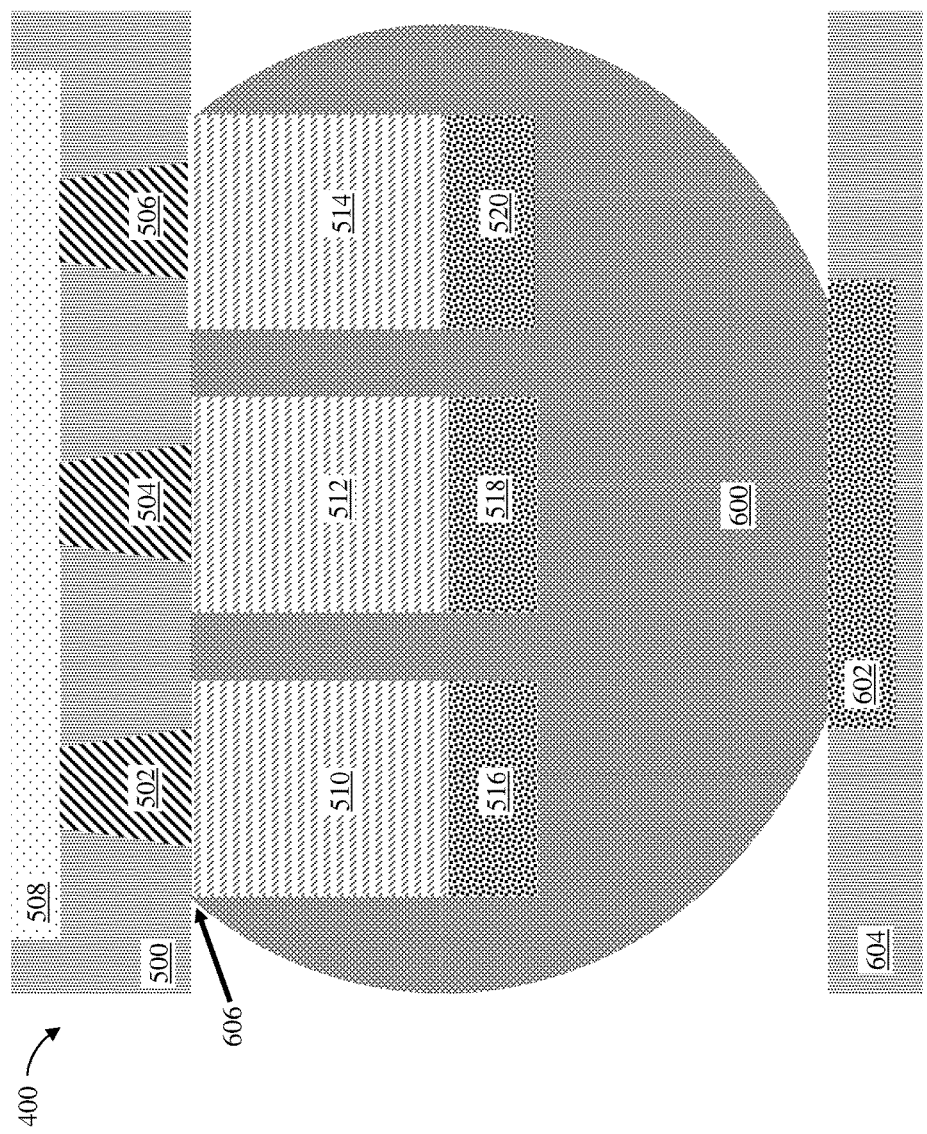
FIG. 6 depicts a cross-sectional view of the second region of the structure depicted in FIG. 4 along the line X-X' after flipping the structure and forming a single large solder bump to electrically short the micro UBMs to a contact region of a laminate during an intermediate operation of a method of fabricating a semiconductor device according to one or more embodiments of the present invention.

Each micro UBM 408A, 408C, and 408E includes a first layer 510, 512, and 514, respectfully, formed on a surface of the PSPI layer 500. In some embodiments, the first layers 510, 512, and 514 are Ni pillars each having a thickness of about 5 microns to about 10 microns. In some embodiments, second layers 516, 518, and 520 are formed on the first layers 510, 512, and 514, respectfully. In some embodiments, the second layers 516, 518, and 520 are Cu layers each having a thickness of about 1 micron. The relatively thick Ni pillars prevent undercutting of the UBMs 408A, 408B, and 408E in an undercut region (e.g., undercut region 606 as depicted in FIG. 6) during a subsequent chip joining process. Each of the micro UBMs 408A, 408C, and 408E includes an individual UBM via 502, 504, and 506 electrically coupling the first layers 510, 512, and 514, respectfully, to the contact region 508. The vias 502, 504, and 506 can be made of any known composition, such as, for example, Ni or Cu. In this manner, micro UBMs are formed that are not converted to an intermetallic during the plating process. Consequently, de-wetting from a base sputtered layer (e.g., strong C4 adhesion layer 208 as depicted in FIG. 2) is avoided. In some embodiments, individual solder bumps 522, 524, and 526 are formed on the second layers 516, 518, and 520, respectfully.

FIG. 6 illustrates a cross-sectional view of the second region 410 of the structure 400 along the line X-X' of FIG. 4 after flipping the structure 400 and forming a single large solder bump 600 to electrically short the micro UBMs 408A-E to a contact region 602 of a laminate 604 during an intermediate operation of a method of fabricating a semiconductor device according to one or more embodiments. The thick Ni pillars 510, 512, and 514 prevent the single large solder bump 600 from undercutting the micro UBMs 408A-E in the undercut region 606. For ease of discussion, only micro UBMs 408A-E are shown electrically shorted to a single large solder bump. It is understood, however, that any number of micro UBMs could be shorted to a large solder bump. For example, two, three, four, five, six, seven, or eight micro UBMs could be shorted to a single large solder bump. In other embodiments, nine or more micro UBMs are shorted to a single large solder bump.

By electrically shorting two or more micro UBMs to a single contact region of the laminate (e.g., contact region 602 of the laminate 604) the shorted micro UBMs act as a single, relatively larger UBM. In some embodiments, the shorted micro UBMs act as a single large UBM having a diameter of at least about 92 um. The number of micro UBMs shorted together can be increased or decreased to form a group of shorted micro UBMs serving as a single UBM having any desired surface area. In this manner, micro UBMs can be shorted together in various regions of a die, such as, for example, an inner region of the die 406 that is not subject to pitch constraints, to form any number of large UBMs having a corresponding plurality of diameters.

Figure 7:
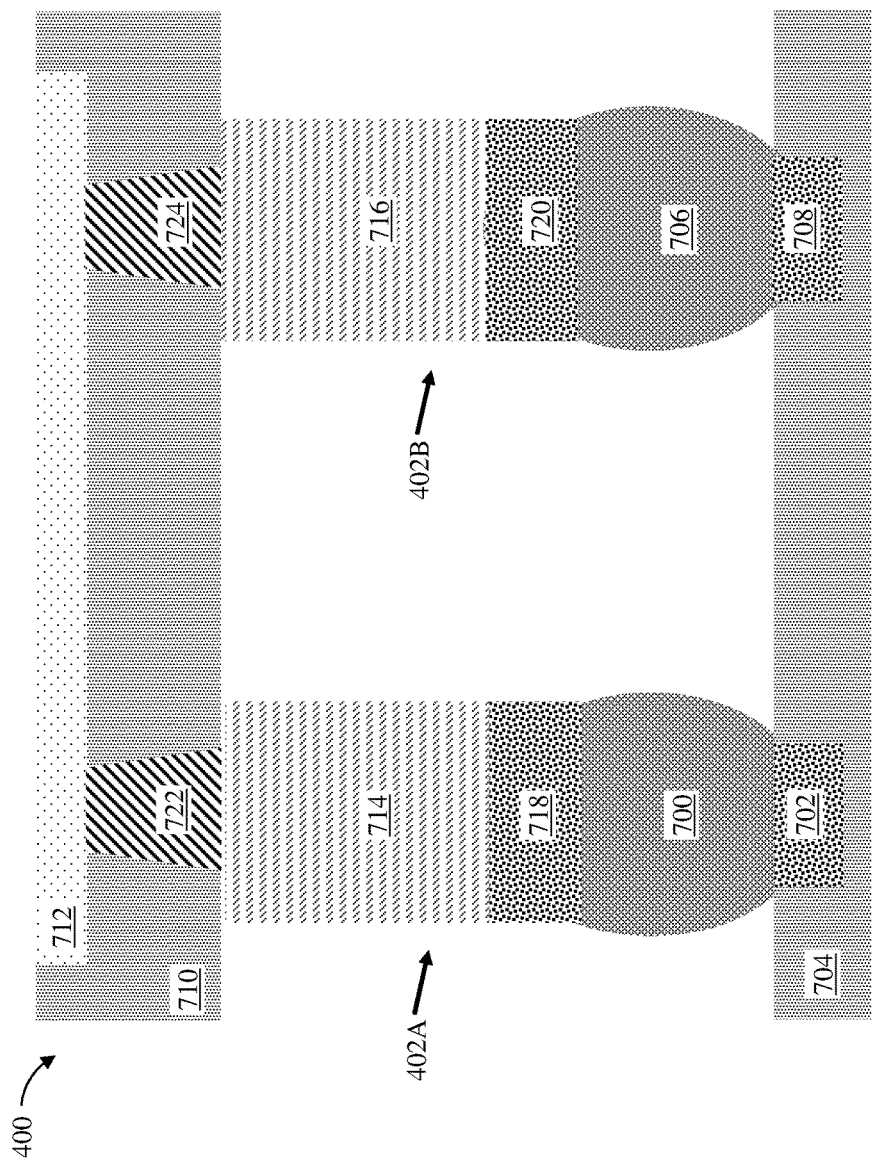
FIG. 7 depicts a cross-sectional view of the first region of the structure depicted in FIG. 4 along the line Y-Y' after flipping the structure and forming individual solder bumps electrically shorting each micro UBMs to a contact region of a laminate during an intermediate operation of a method of fabricating a semiconductor device according to one or more embodiments of the present invention.

FIG. 7 illustrates a cross-sectional view of the first region 404 of the structure 400 along the line Y-Y' of FIG. 4 after flipping the structure 400 and forming a solder bump 700 to electrically short the micro UBM 402A to a contact region 702 of a laminate 704 and forming a solder bump 706 to electrically short the micro UBM 402B to a contact region 708 of the laminate 704 during an intermediate operation of a method of fabricating a semiconductor device according to one or more embodiments. In some embodiments, a sputtering stack (not depicted) is formed on a PSPI layer 710 according to one or more embodiments. In some embodiments, a contact region 712 is formed in the PSPI layer 710 under the micro UBMs 402A and 402B. The contact region 712 can be of any suitable contact material, such as, for example, aluminum.

The micro UBMs 402A and 402B can be formed in a like manner as the UBMs 408A, 408C, and 408E (as depicted in FIG. 5) according to one or more embodiments. In some embodiments, the micro UBMs 402A and 402B include a first layer 714 and 716, respectfully, formed on a surface of the PSPI layer 710. In some embodiments, the first layers 714 and 716 are Ni pillars each having a thickness of about 5 microns to about 10 microns. In some embodiments, second layers 718 and 720 are formed on a surface of the first layers 714 and 716, respectfully. In some embodiments, the second layers 718 and 720 are Cu layers each having a thickness of about 1 micron.

The micro UBM 402A includes a via 722 electrically coupling the first layer 714 to the contact region 712. Similarly, the micro UBM 402B includes a via 724 electrically coupling the first layer 716 to the contact region 712. The vias 722 and 724 can be made of any known composition, such as, for example, Ni or Cu.

Figure 8:
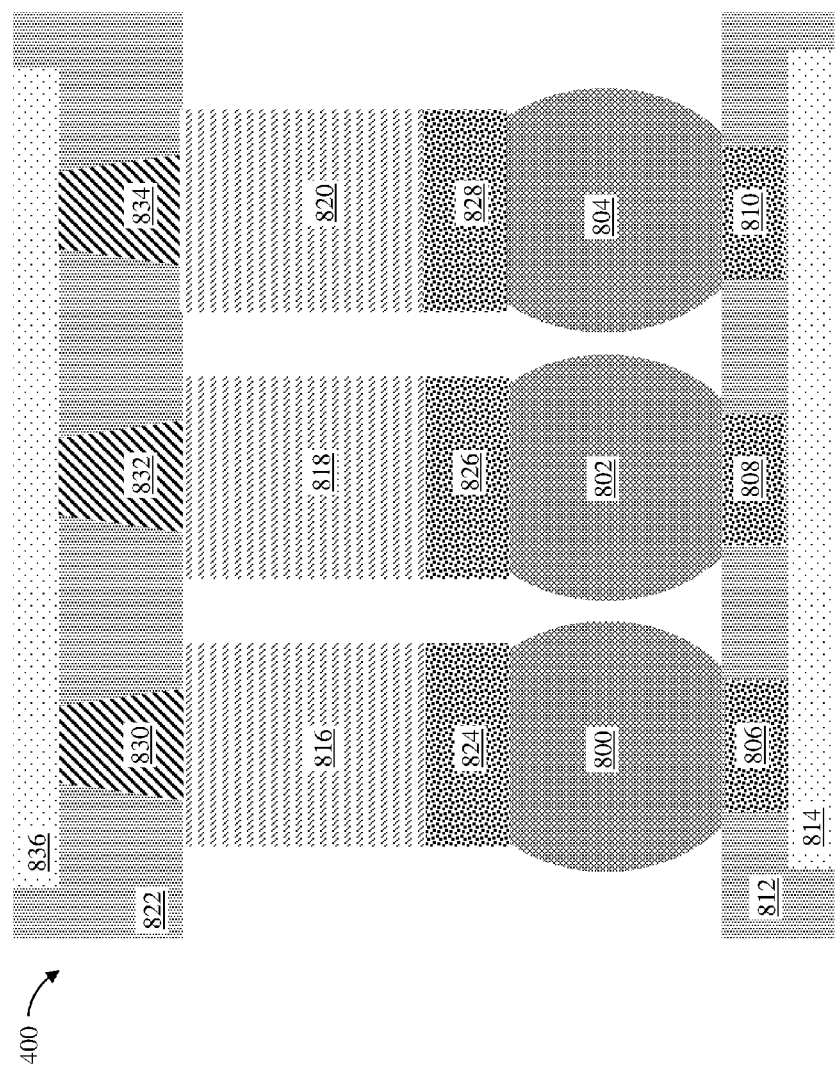
FIG. 8 depicts a cross-sectional view of the second region of the structure depicted in FIG. 4 along the line X-X' after flipping the structure and forming solder bumps to electrically short the micro UBMs to contact regions of a laminate during an intermediate operation of a method of fabricating a semiconductor device according to one or more embodiments of the present invention.

FIG. 8 illustrates a cross-sectional view of the second region 410 of the structure 400 along the line X-X' of FIG. 4 after flipping the structure 400 and forming solder bumps 800, 802, and 804 to electrically short the micro UBMs 408A, 408C, and 408E to contact regions 806, 808, and 810 of a laminate 812 during an intermediate operation of a method of fabricating a semiconductor device according to one or more embodiments. In some embodiments, the contact regions 806, 808, and 810 of the laminate 812 are shorted to a shorting layer 814.

In some embodiments, the micro UBMs 408A-E can be formed in a like manner as the C4s 212 and 222 (e.g., having Ni/Cu/Ni/Cu layers as depicted in FIGS. 2 and 3) according to one or more embodiments. In some embodiments, the micro UBMs 408A-E can be formed in a like manner as the UBMs 408A, 408C, and 408E (as depicted in FIG. 5) according to one or more embodiments. In some embodiments, the micro UBMs 408A, 408C, and 408E include a first layer 816, 818, and 820, respectfully, formed on a surface of a PSPI layer 822. In some embodiments, the first layers 816, 818, and 820 are Ni pillars each having a thickness of about 5 microns to about 10 microns. In some embodiments, second layers 824, 826, and 828 are formed on a surface of the first layers 816, 818, and 820, respectfully. In some embodiments, the second layers 824, 826, and 828 are Cu layers each having a thickness of about 1 micron. The micro UBMs 408A, 408C, and 408E each include a via 830, 832, and 834 electrically coupling a first layer (e.g. 816, 818, 820) to a contact region 836. The vias 830, 832, and 834 can be made of any known composition, such as, for example, Ni or Cu.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a first set of micro under-bump metallizations (UBMs) on a surface of a photosensitive polyimide (PSPI) layer in a first region of a die comprising a first pitch constraint, each micro UBM comprising a via electrically coupling the respective UBM to a contact region of the die;
    forming a second set of micro UBMs on a surface of the PSPI layer in a second region of the die comprising a second pitch constraint, each micro UBM comprising a via electrically coupling the respective UBM to a contact region of the die, the second pitch constraint higher than the first pitch constraint, wherein the first region and the second region are configured to have a matching plateable surface areas;
    forming a single solder bump electrically shorting the first set of micro UBMs to a single contact region of a laminate, wherein the single solder bump has an elliptical shape; and
    forming individual solder bumps electrically shorting each of the second set of micro UBMs to a contact region of a laminate.

2. The method of claim 1, wherein the first region is an inner region of the die.

3. The method of claim 1, wherein the second region is an edge region of the die.

4. The method of claim 1, wherein the shorted first set of micro UBMs act as a single, relatively larger UBM.

5. The method of claim 4, wherein the shorted first set of micro UBMs comprises three, four, or five micro UBMs.

6. The method of claim 5, wherein the shorted first set of micro UBMs comprises a surface area equal to a surface area of a single large UBM comprising a diameter of at least about 92 um.

7. The method of claim 1, wherein each micro UBM further comprises a first layer comprising Ni and a second layer comprising Cu.

8. The method of claim 7, wherein the first layer comprises a thickness of about 5 um to about 10 um and the second layer comprises a thickness of about 1 um.

9. A semiconductor device comprising:
    a first set of micro under-bump metallizations (UBMs) on a surface of a photosensitive polyimide (PSPI) layer in a first region of a die comprising a first pitch constraint, each micro UBM comprising a via electrically coupling the respective UBM to a contact region of the die;
    a second set of micro UBMs on a surface of the PSPI layer in a second region of the die comprising a second pitch constraint, each micro UBM comprising a via electrically coupling the respective UBM to a contact region of the die, the second pitch constraint higher than the first pitch constraint, and wherein the first region and the second region are configured to have a matching plateable surface areas;
    a single solder bump electrically shorting the first set of micro UBMs to a single contact region of a laminate, wherein the single solder bump has a single elliptical shape; and
    individual solder bumps electrically shorting each of the second set of micro UBMs to a contact region of a laminate.

10. The device of claim 9, wherein the first region is an inner region of the die.

11. The device of claim 9, wherein the second region is an edge region of the die.

12. The device of claim 9, wherein the shorted first set of micro UBMs act as a single, relatively larger UBM.

13. The device of claim 12, wherein the shorted first set of micro UBMs comprises three, four, or five micro UBMs.

14. The device of claim 13, wherein the shorted first set of micro UBMs comprises a surface area equal to a surface area of a single large UBM comprising a diameter of at least about 92 um.

* * * * *